(12) United States Patent  (10) Patent No.: US 7,045,860 B2
Kikuchi et al.  (45) Date of Patent: May 16, 2006

(54) SEMICONDUCTOR DEVICE AND MANUFACTURING METHOD THEREOF

(75) Inventors: Suichi Kikuchi, Oizumi-machi (JP); Masaaki Momen, Ojiya (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/215,196

(22) Filed: Aug. 9, 2002

(65) Prior Publication Data
US 2003/0030115 A1 Feb. 13, 2003

(30) Foreign Application Priority Data
Aug. 10, 2001 (JP) ............... 2001-243724

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. .......... 257/343; 257/402; 257/404; 257/408; 257/411; 257/391

(58) Field of Classification Search ........... 257/408, 257/402, 404, 391, 411, 343; 365/184; 438/217
See application file for complete search history.

(56) References Cited

U.S. PATENT DOCUMENTS

| 4,467,452 A | * | 8/1984 | Saito et al. ............... 365/184 |
| 6,121,666 A | * | 9/2000 | Burr ......................... 257/408 |
| 6,232,636 B1 | * | 5/2001 | Simpson et al. ........... 257/347 |
| 6,255,154 B1 | * | 7/2001 | Akaishi et al. ............ 438/217 |
| 6,292,183 B1 | * | 9/2001 | Yamazaki et al. ......... 345/211 |
| 6,690,070 B1 | | 2/2004 | Sekikawa et al. |

FOREIGN PATENT DOCUMENTS

| JP | 4-44273 | 2/1992 |
| JP | 6-334129 | 12/1994 |
| JP | 9-64193 | 3/1997 |
| JP | 10-32262 | 2/1998 |
| JP | 11-163336 | 6/1999 |
| JP | 11-289061 | 10/1999 |
| KR | 1999-83271 | 11/1999 |

* cited by examiner

Primary Examiner—Steven Loke
(74) Attorney, Agent, or Firm—Morrison & Foerster LLP (57) ABSTRACT

The semiconductor device of this invention has a P type well region formed inside a P type semiconductor substrate, on which at least three gate insulating films each having a different thickness are formed. Also, the device has the gate electrode formed extending over the three gate insulating films. The ion implantation of the impurity for controlling the threshold voltage is performed only under the thinnest gate insulating film of the three gate insulating films.

2 Claims, 13 Drawing Sheets

SEMICONDUCTOR DEVICE AND MANUFACTURING METHOD THEREOF

BACKGROUND OF THE INVENTION

1. Field of the Invention

This invention relates to a semiconductor device and its manufacturing method, especially to an improvement of a breakdown voltage of a high voltage MOS (Metal Oxide Silicon) transistor for a level shifter used in a LCD (Liquid Crystal Display) driver and an EL (Electro Luminescence) driver.

2. Description of the Related Art

The semiconductor device of the prior art will be explained hereinafter by referring to a cross-sectional view of a LOCOS (Local Oxidation of Silicon) offset type high voltage MOS transistor shown in FIG. 13.

Figure 13:
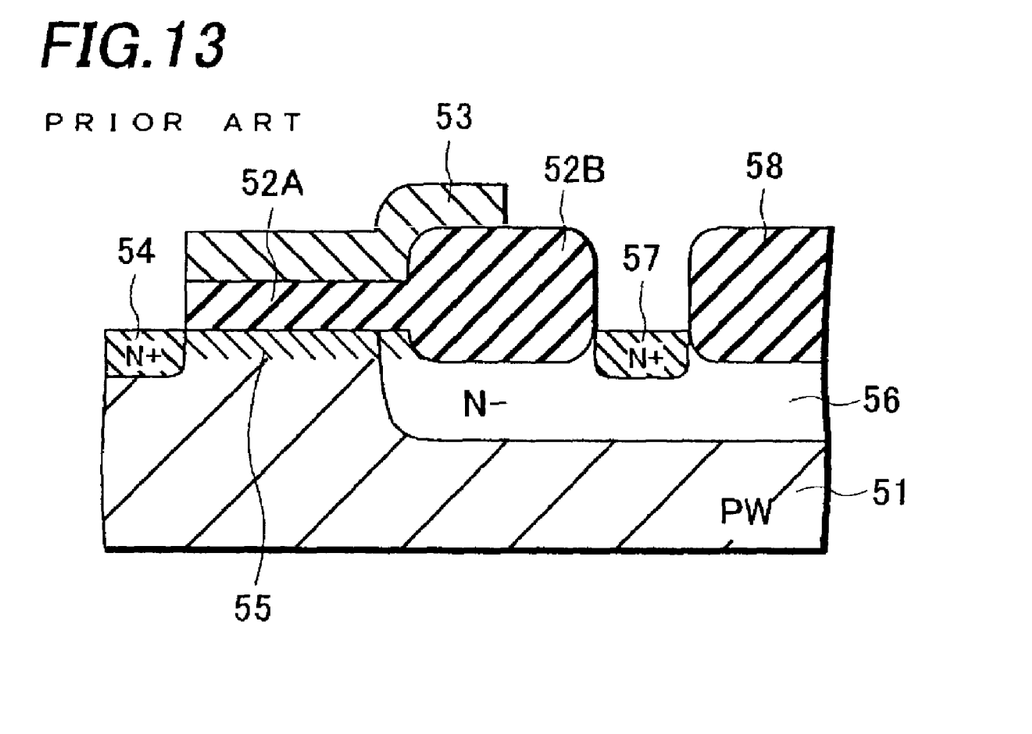
FIG. 13 is a cross-sectional view showing a conventional semiconductor device.

As shown in FIG. 13, a gate electrode 53 is formed through first and second gate insulating films 52A and 52B on a semiconductor layer of a first conductivity type (for example, a P type semiconductor substrate or a P type semiconductor layer, and a P type well region is used in this embodiment). An N+ type source region 54 is formed adjacent one end of the gate electrode 53 and an N− type drain region 56 is formed facing the source region 54 with a channel region 55 between them. Also, an N+ type drain region 57 is formed away from the other end of the gate electrode 53 and surrounded by the N− type drain region 56. A reference numeral 58 indicates a device isolation film.

The gate insulating film (the second gate insulating film 52B) is thicker than that of the normal voltage MOS transistor (for example, 10V). That is, the gate insulating film of the high voltage MOS transistor has a thickness of 120 nm, compared to the gate insulating film of the normal voltage MOS transistor with a thickness of 15 mn.

Additionally, the concentration of the electric field in this region is relieved because a LOCOS insulating film (the second gate insulating film 52B) is formed on the N− type drain region 56, improving the breakdown voltage.

Boron ion impurities for controlling a threshold voltage are implanted into an upper region of the P type well region 51 and thermally diffused underneath the channel region 55 (the shaded area in the channel region 55 in FIG. 13).

The impurity concentrations in the N− type drain region 56 and the semiconductor layer (P type well region 51) mainly determine the breakdown voltage of the transistor. Therefore, when the impurities are implanted into the channel region for controlling the threshold voltage, the breakdown voltage is reduced as the impurity concentration of the P type well region 51 increases.

Therefore, this invention is directed to providing a semiconductor device with an improved breakdown voltage and its manufacturing method.

SUMMARY OF THE INVENTION

The semiconductor device of this invention has a gate electrode formed on a semiconductor layer through a gate insulating film and source and drain regions formed adjacent the gate electrode. An ion implanted layer for controlling the threshold voltage is formed underneath the gate insulating film. The impurity concentration of the ion implanted layer differs from each other between the source region side and the drain region side.

The semiconductor device of this invention has a gate electrode formed on a semiconductor layer through a gate insulating film and source and drain regions formed adjacent the gate electrode. The gate insulating film includes three insulating films each having a different thickness. An ion implanted layer for controlling a threshold voltage is formed only underneath the thinnest insulating film.

Furthermore, the semiconductor device of this invention has a thick gate insulating film, a thin gate insulating film, both formed on a semiconductor layer, an ion implanted layer for controlling a threshold voltage formed only underneath the thin gate insulating film, a gate electrode extending over the thick gate insulating film as well as the thin gate insulating film, and source and drain regions formed adjacent the gate. The device also has another gate insulating film thicker than two other gate insulating films.

One of the characteristics of the manufacturing method of the semiconductor device having a gate electrode formed on a semiconductor layer through a gate insulating film and source and drain regions adjacent the gate electrode is that an ion implanted layer for controlling the threshold voltage is formed underneath the gate insulating film so that the impurity concentration of the ion implanted layer differs from each other between the source region side and the drain region side.

Additionally the manufacturing method includes a process for forming a thick gate insulating film and a thin gate insulating film adjacent the thick gate insulating film on a semiconductor layer and a process for forming an ion implanted layer for controlling the threshold voltage only underneath the thin gate insulating film. The method includes a process for forming another gate insulating film thicker than the other two gate insulating films. Furthermore, a gate electrode is formed extending over the three gate insulating films. A source region and a drain region are formed adjacent the gate electrode The ion implanted layer is formed through a self-alignment, taking advantage of the difference in thickness of the three gate insulating films.

DETAILED DESCRIPTION OF THE INVENTION

The semiconductor device of this invention and its manufacturing method will be explained by referring to the drawings. The embodiment, in which this invention is applied to a semiconductor device having various kinds of high voltage transistors for configuring a display driver, will be explained.

The display device includes various kinds of flat panel display devices such as an LCD display device, an LED display device, an organic EL (electro luminescence) display device, an inorganic EL display device, a PDP (plasma display) device, and a FED (field emission display) device.

Figure 12:
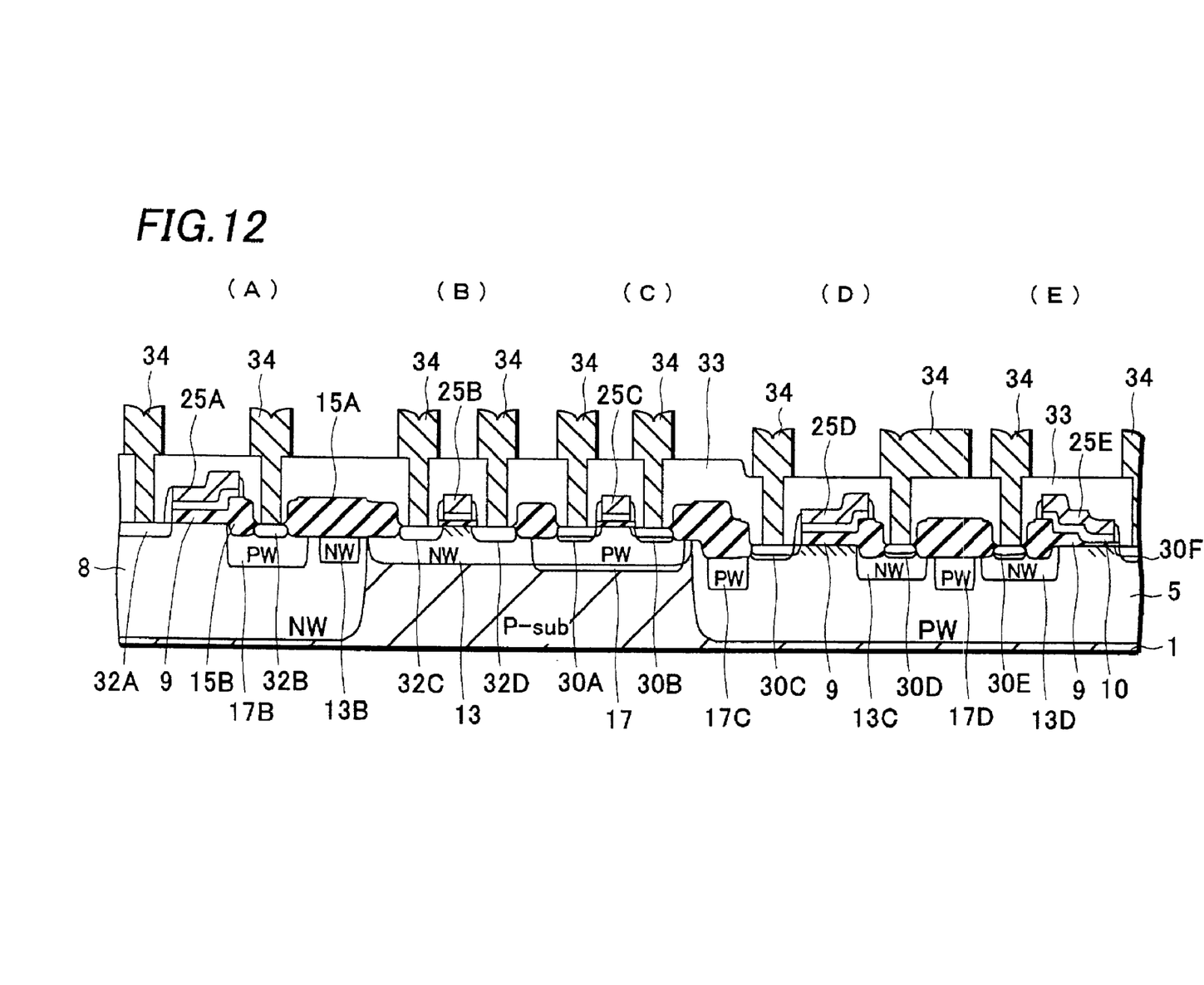
FIG. 12 is a cross-sectional view showing a device intermediate according to the manufacturing method of the semiconductor device of the embodiment, following the step of FIG. 11.

An LCD driver, as an example, will be explained. As shown in FIG. 12, the LCD driver has, from left to right in the figure, a high voltage (for example, 50V) P channel type MOS transistor (A), a normal voltage (for example, 10V) P channel type MOS transistor (B), a normal voltage (for example, 10V) N channel type MOS transistor (C), a high voltage (for example, 50V) N channel type MOS transistor (D), and an N channel type MOS transistor E for a level shifter (for example, 50V).

As shown in FIG. 12, one of the characteristics of this invention is that the portion of a gate insulating film at a source side is thin and the portion of the gate insulating film at a drain side is thick because the breakdown strength is required only for the drain in the high voltage MOS transistor (the N channel type MOS transistor for the level shifter, in this embodiment). The breakdown strength for the drain is provided by the thick gate insulating film, and a threshold voltage (the voltage of the onset of an inversion layer formation) can be kept at low level under the thin gate insulating film.

Furthermore, as shown in the level shift transistor (E) of FIG. 12, the gate insulating film has three layers including a LOCOS insulating film 15B having a LOCOS offset configuration, which relieves electric field concentration more than the conventional configuration.

The manufacturing method of this embodiment will be explained hereinafter.

Figure 1:
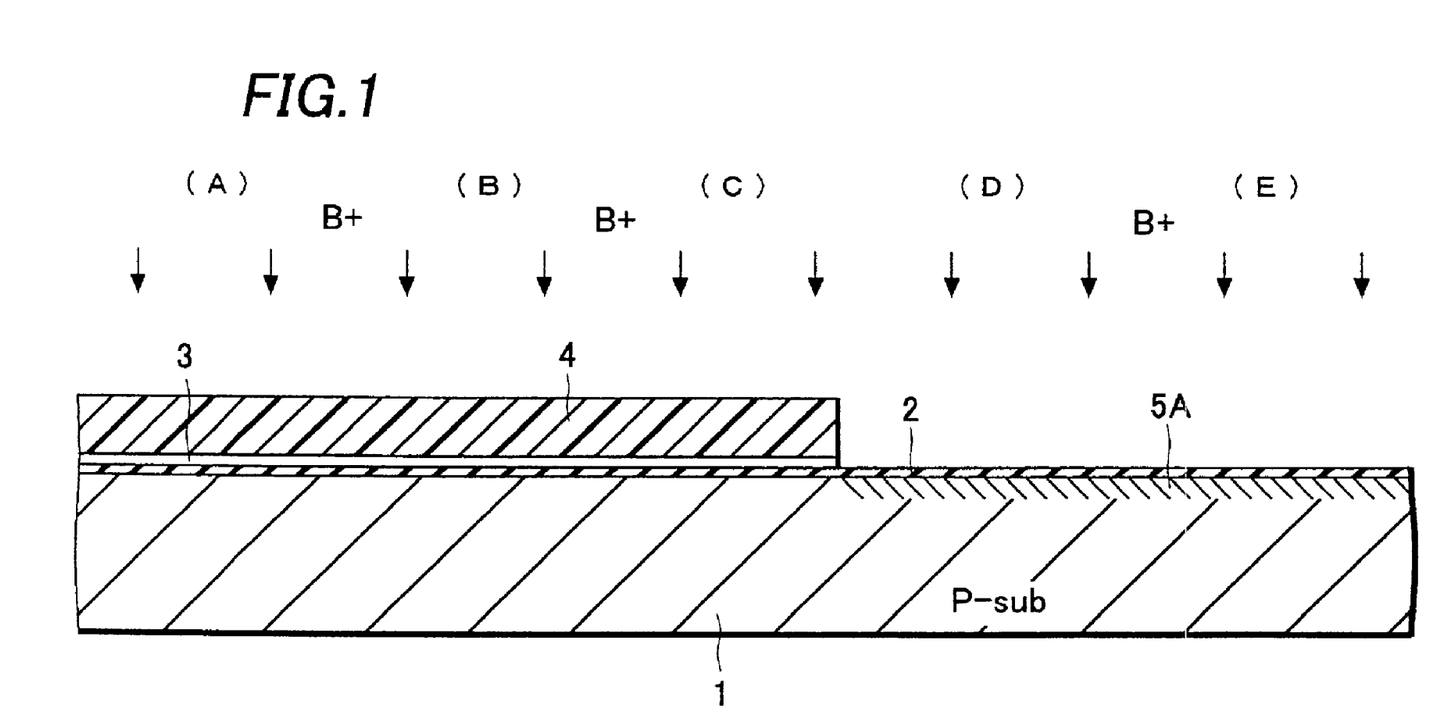
FIG. 1 is a cross-sectional view showing a device intermediate according to a manufacturing method of a semiconductor device of an embodiment of this invention.

First, as shown in FIG. 1, an insulating film 2 (a pad insulating film for forming a LOCOS insulating film described later) with a thickness of 100 nm is formed on, for example, a P type semiconductor (Si) substrate 1 through thermal oxidation. Then, a silicon nitride film 3 with a thickness of 100 nm is formed on the insulating film 2.

A photoresist film 4 is formed in the region, in which the high voltage P channel type MOS transistor, the normal voltage P channel type MOS transistor, and the normal voltage N channel transistor are to be formed. The silicon nitride film 3 is removed from the region, in which the high voltage N channel type MOS transistor and the N channel type MOS transistor for the level shifter are to be formed, by using the photoresist film 4 as a mask.

A P type impurities, such as boron ions, are implanted into the location of the substrate for the high voltage N channel type MOS transistor and the N channel type MOS transistor for the level shifter with an implantation condition of 80 KeV acceleration voltage and $1 \times 10^{13}/cm^2$ dose by using the photoresist film 4 and the silicon nitride film 3 as a mask, forming an ion implanted layer 5A for forming a P type well region.

Figure 2:
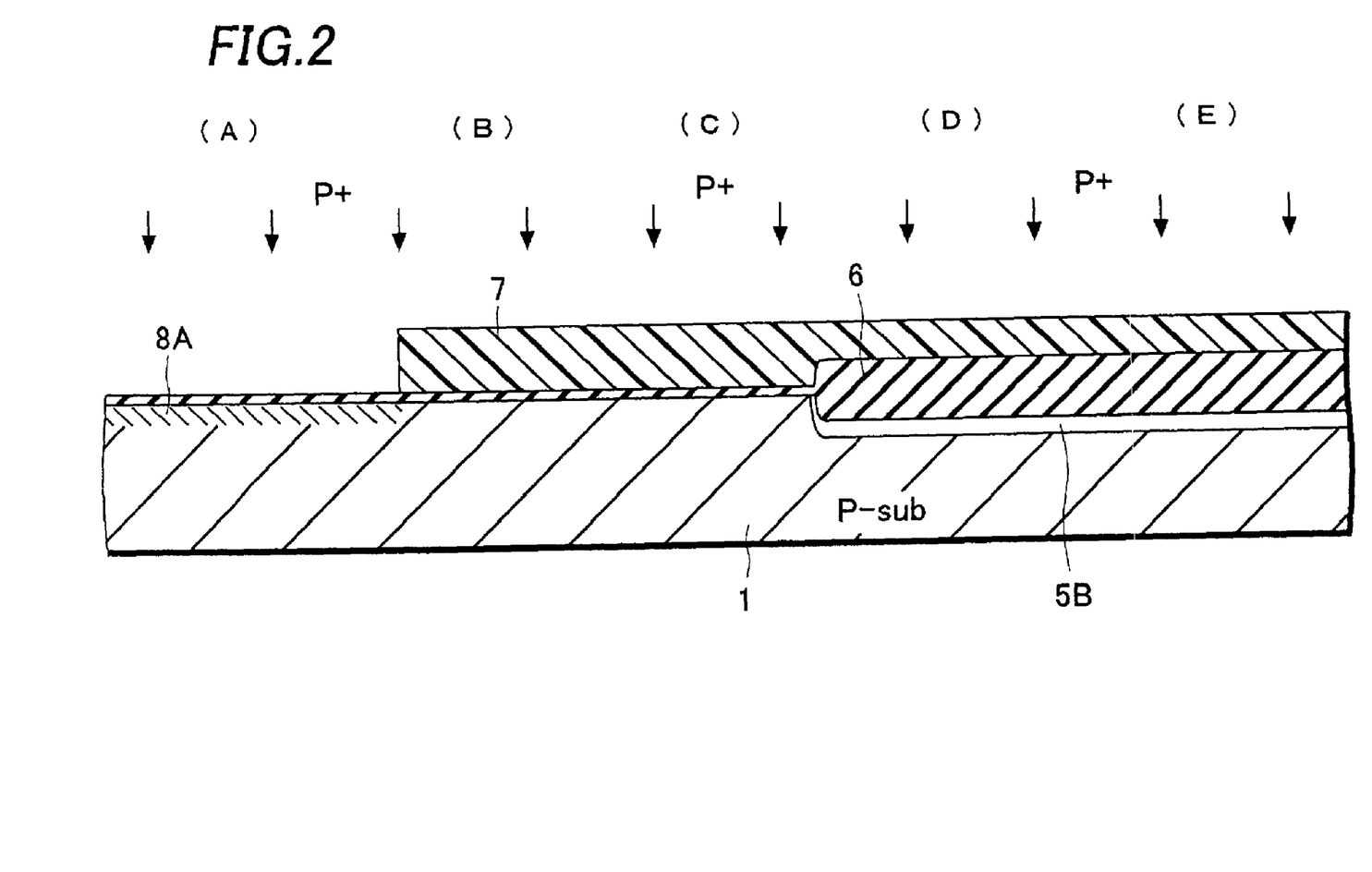
FIG. 2 is a cross-sectional view showing a device intermediate according to the manufacturing method of the semiconductor device of the embodiment, following the step of FIG. 1.

Next, as shown in FIG. 2, a LOCOS insulating film 6 with a thickness of 800 nm is formed on the region, in which the high voltage N channel type MOS transistor and the N channel type MOS transistor for the level shifter are to be formed, by the selective oxidation (in $O_2$ atmosphere at about 1000° C. for one hour) using the silicon nitride film 3 as a mask, after removing the photoresist film 4. Also, an impurity layer 5B is formed because the ion implanted layer 5A under the LOCOS insulating film 6 is somewhat diffused (the impurity layer 5B will become a P type well region 5 after a diffusion process later described in FIG. 3).

Then, a photoresist film 7 is formed on the region, in which the normal voltage P channel type MOS transistor, the normal voltage N channel type MOS transistor, the high voltage N channel type MOS transistor, and the N channel type MOS transistor for the level shifter are to be formed. Then, an N type impurities, such as phosphorus ions, are implanted with an implantation condition of 160 KeV acceleration voltage and $4 \times 10^{12}/cm^2$ dose by using the photoresist film 7 as a mask, forming an ion implanted layer 8A for forming an N type well region under the region for the high voltage P channel type MOS transistor.

Figure 3:
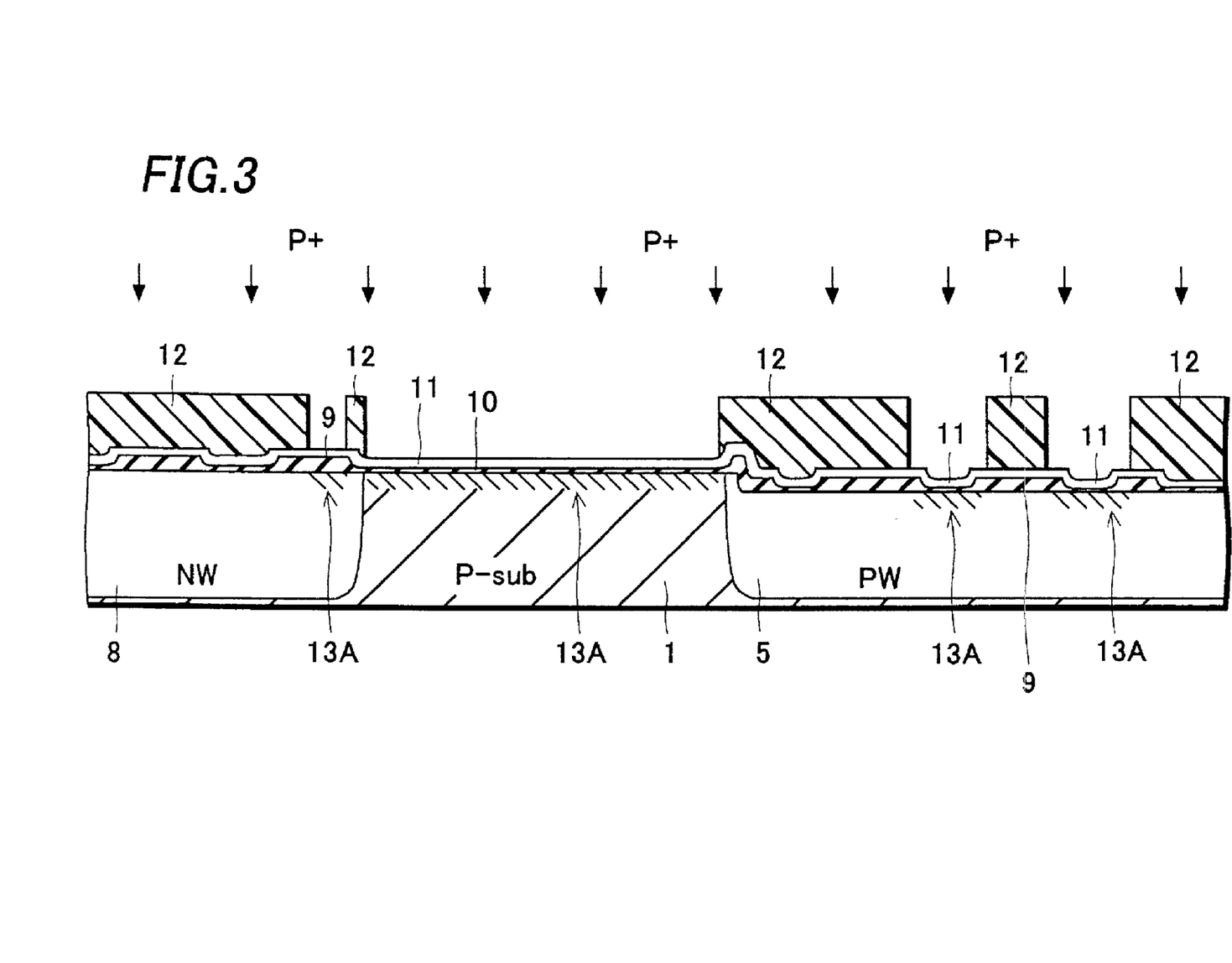
FIG. 3 is a cross-sectional view showing a device intermediate according to the manufacturing method of the semiconductor device of the embodiment, following the step of FIG. 2.

Next, the photoresist film 7 and the LOCOS insulating film 6 are removed. The P type well region 5 and the N type well region 8 are formed through a diffusion process (in a $N_2$ atmosphere at about 1200° C. for 8 hours) performed on the ion implanted layer 5A and the ion implanted layer 8A respectively, as shown in FIG. 3.

A thick gate insulating film 9 (a portion of a first gate insulating film) with a thickness of 120 nm is formed on the entire surface of the substrate through pyrolytic oxidation at 875° C. A photoresist film (not shown in the figure) is formed on the gate insulating film 9 in a part of the region, in which the high voltage P channel type MOS transistor, the high voltage N channel type MOS transistor, and the N channel type MOS transistor for the level shifter are to be formed. The gate insulating film 9 is removed from the region not covered with the photoresist film.

After the removal of the photoresist film, a thin gate insulating film 10 (a part of the first gate insulating film) with a thickness of about 15 nm is formed by a pyrolytic oxidation of the entire surface of the substrate at about 850° C., followed by a thermal processing in $N_2$ atmosphere at 900° C. for 10 minutes. Also, the thickness of the gate insulating film 9 somewhat increases during this processing because of the oxidation of the substrate surface under the gate insulating film 9.

Then, a polysilicon film 11 (a pad polysilicon film for forming a LOCOS insulating film described later) with 50 nm of thickness is formed on the entire surface of the substrate. An N type impurities, such as phosphorus ions, are implanted with an implantation condition of 140 KeV and $7\times10^{12}/cm^2$ dose by using a photoresist film 12 formed on the polysilicon film 11 as a mask. As shown in FIG. 3, an ion implanted layer 13A is formed at the region, where a device isolation film 15A (see FIG. 4) to be formed between the high voltage P channel type MOS transistor and the normal voltage P channel type MOS transistor and at the region, where the normal voltage P channel type MOS transistor and the normal voltage N channel type MOS transistor are to be formed, and at the region, where the drain of the high voltage N channel type MOS transistor and the drain of the N channel type transistor for the level shifter are to be formed.

Figure 4:
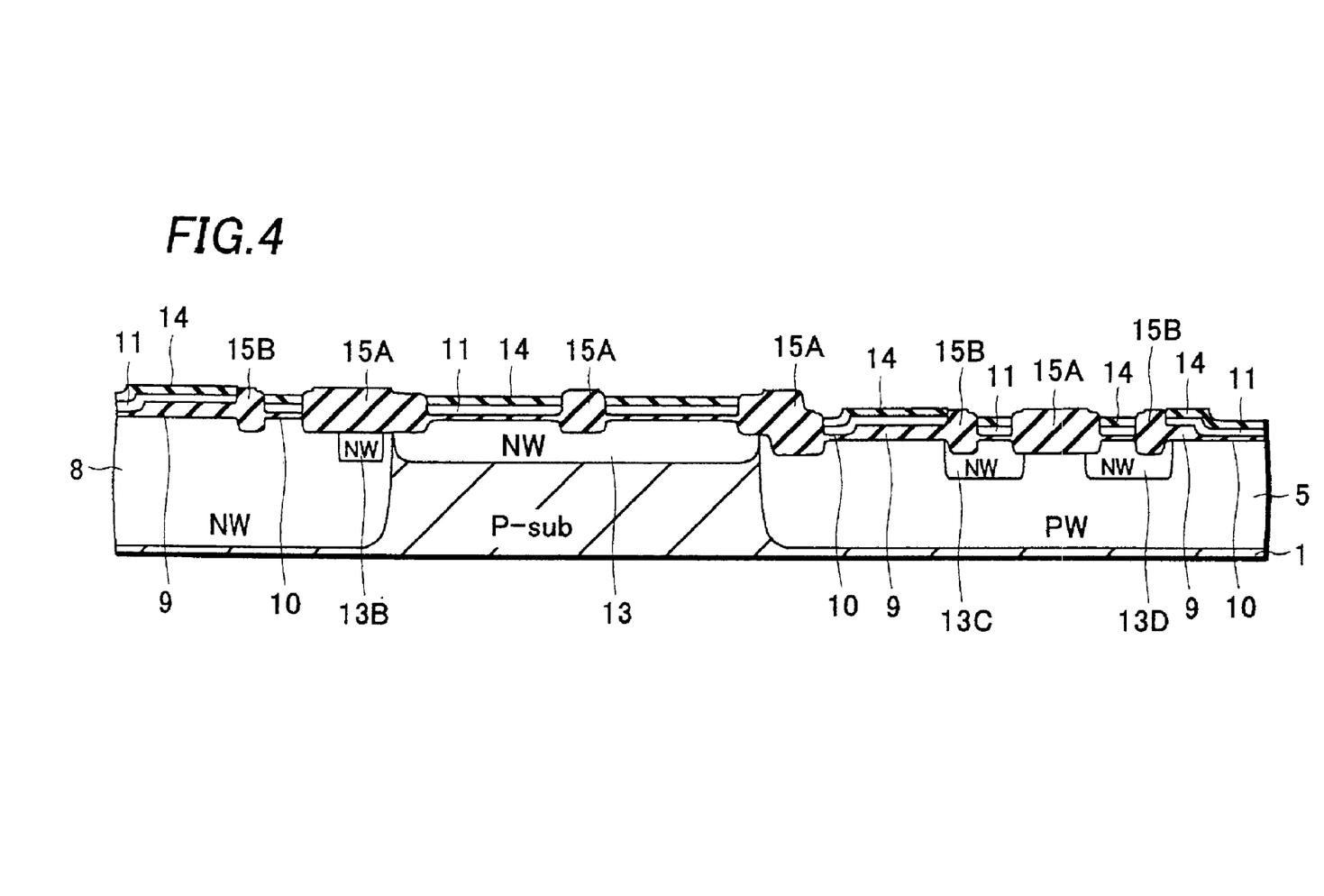
FIG. 4 is a cross-sectional view showing a device intermediate according to the manufacturing method of the semiconductor device of the embodiment, following the step of FIG. 3.

Then, as shown in FIG. 4, the device isolation film 15A made of a LOCOS insulating film and a second gate insulating film 15B also made of a LOCOS insulating film are formed through selective oxidation on the substrate by using a silicon nitride film 14 formed on the polysilicon film 11 as a mask. The ion implanted layer 13A is diffused through selective oxidation, forming an N type channel stopper layer 13B under the device isolation film 15A between the high voltage P channel type MOS transistor and the normal voltage P channel type MOS transistor. An N type well region (NW) 13 is formed at the region, where the normal voltage P channel type MOS transistor and the normal voltage N channel type MOS transistor are to be formed. A drain region 13C is formed in the region of the high voltage N channel type MOS transistor to include the lower portion of the second gate insulating film 15B and a drain region 13D is formed in the region of the N channel type MOS transistor for the level shifter to include the lower portion of the second gate insulating film 15B. The N type channel stopper layer 13B, the drain region 13C and the drain region 13D, which are formed through the same processes as those for forming the N type well region (NW), are indicated as NWs in the figure for the sake of convenience.

The thick gate insulating film 9 (a part of the first gate insulating film) is first formed in this embodiment, as described earlier. Then the thin gate insulating film 10 (a part of the first insulating film) is formed after removing a part of the thick gate insulating film 9. Furthermore, the second gate insulating film 15B made of the LOCOS insulating film is formed so as to be adjacent the thick gate insulating film 9. However, the order of forming the insulating films 9, 10, 15B is not limited to this order. Other orders of forming the films are possible.

That is, it is possible to form the second gate insulating film before the formation of the first gate insulating film. Also, the order of forming two insulating films 9 and 10, which provide the first gate insulating film, can be reversed. Furthermore, the formation of the second gate insulating film 15B can be performed between the formations of the two insulating films 9, 10.

Figure 5:
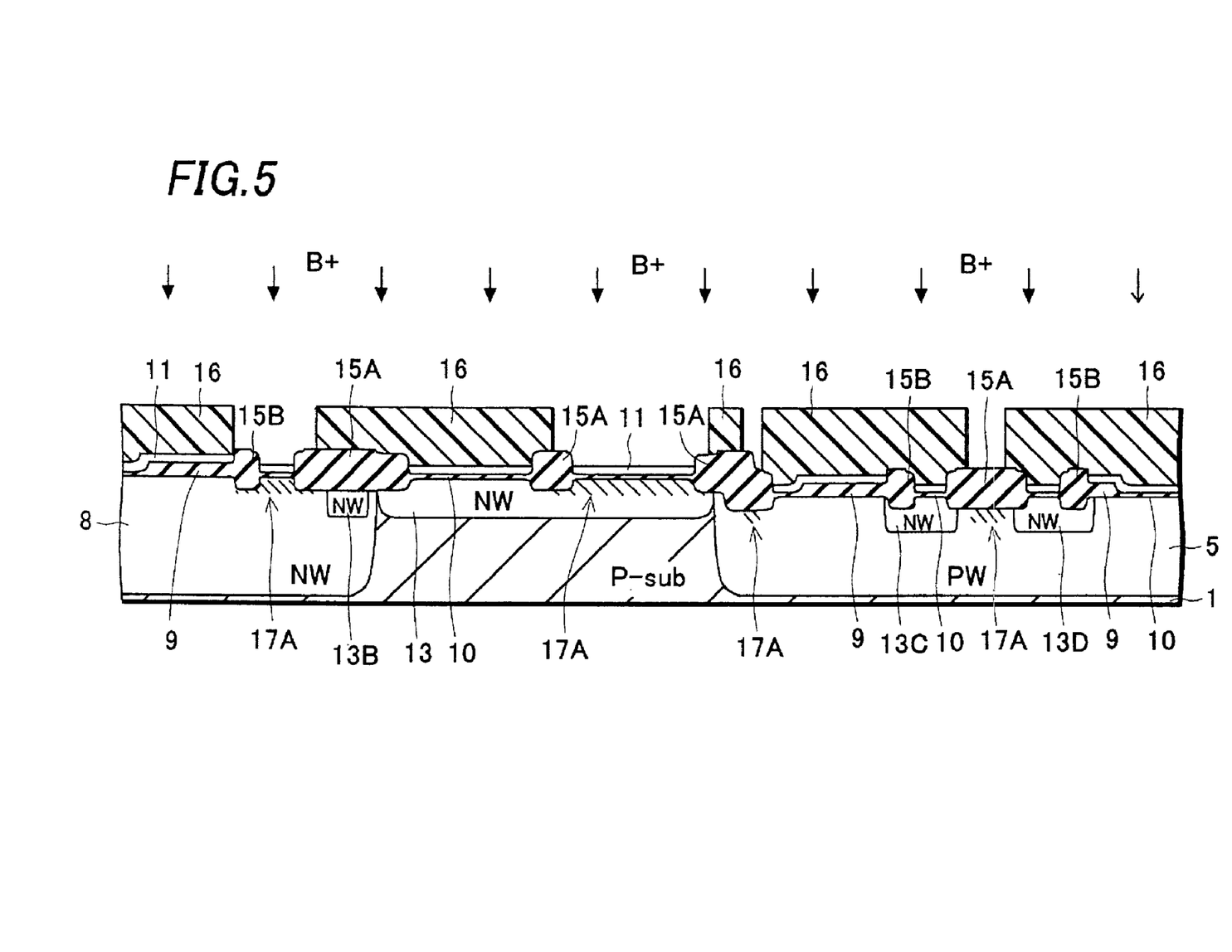
FIG. 5 is a cross-sectional view showing a device intermediate according to the manufacturing method of the semiconductor device of the embodiment, following the step of FIG. 4.

Next, a photoresist film 16 is formed, as shown in FIG. 5, on a part of the region, where the high voltage P channel type MOS transistor to be formed, on the region where the normal voltage P channel type MOS transistor to be formed, on a part of the device isolation film 15A formed between the regions where the normal voltage N channel type MOS transistor and the high voltage N channel type MOS transistor to be formed, on the region where the high voltage N channel type MOS transistor to be formed, on a part of the device isolation film 15A formed between the regions where the high voltage N channel type MOS transistor and the N channel type MOS transistor for the level shifter to be formed, and on the region where the N channel type MOS transistor for the level shifter to be formed. A P type impurity such as boron ion is implanted with an implantation condition of 160 KeV and $1.45\times10^{13}/cm^2$ dose by using the photoresist film 16 as a mask to form an ion implanted layer 17A in each region.

Figure 6:
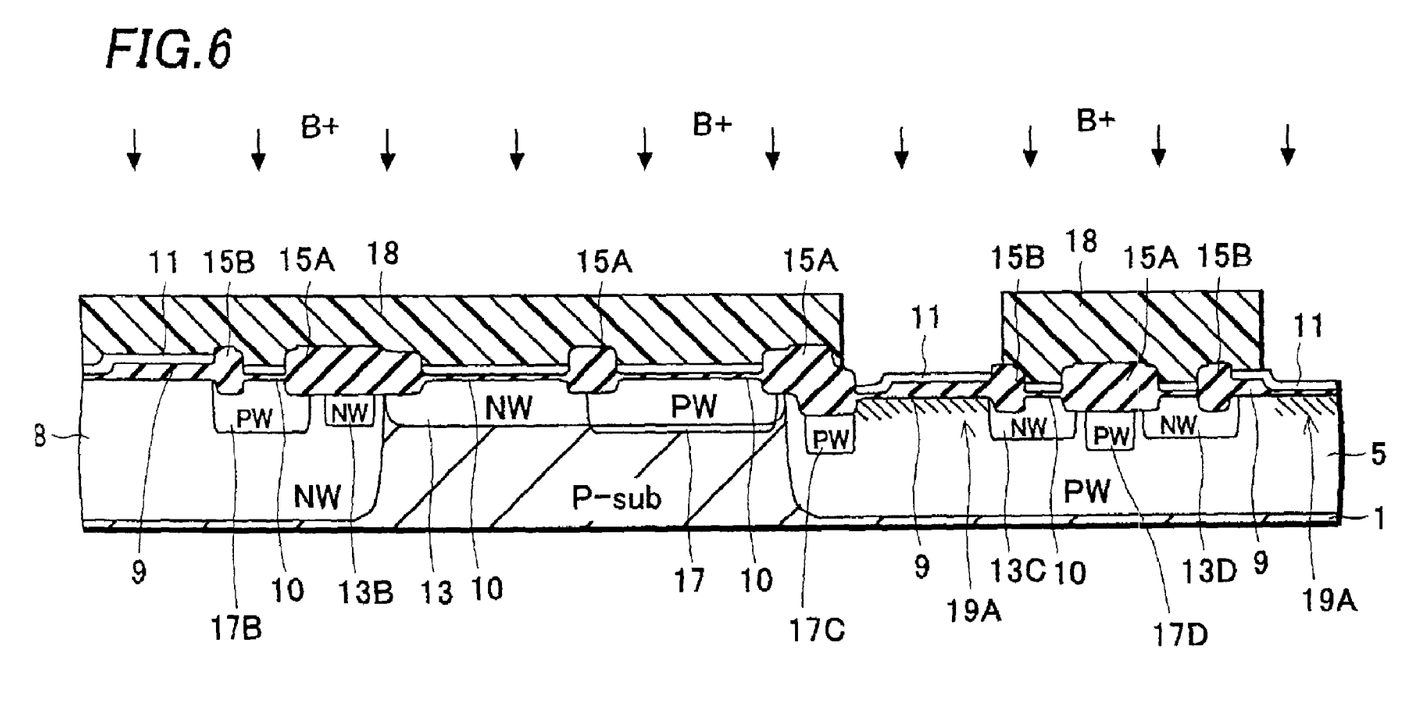
FIG. 6 is a cross-sectional view showing a device intermediate according to the manufacturing method of the semiconductor device of the embodiment, following the step of FIG. 5.

After removing the photoresist film 16, a diffusion process (in $N_2$ atmosphere at about 1100° C. for 3 hours) is performed on the ion implanted layer 17A, as shown in FIG. 6, to form a drain region 17B of the high voltage P channel type MOS transistor, a P type well region (PW) 17 of the normal voltage N channel type MOS transistor, a P type channel stopper layer 17C under the device isolation film 15A between the regions where the normal voltage N channel type MOS transistor and the high voltage N channel type MOS transistor to be formed, and a P type channel stopper layer 17D under the device isolation film 15A between the regions where the high voltage N channel type MOS transistor and the N channel type MOS transistor for the level shifter are to be formed. Also, the drain region 17B, the P type channel stopper layer 17C, and the P type channel stopper layer 17D which are formed through the same processes as those for forming the P type well region (PW), are indicated as PWs in the figure for the sake of convenience.

A photoresist film 18 is then formed on the regions, where the high voltage P channel type MOS transistor, the normal voltage P channel type MOS transistor, the normal voltage N channel type MOS transistor, the drain region 13C of the high voltage N channel type MOS transistor, and the drain region 13D of the N channel type MOS transistor for the level shifter are to be formed.

An ion implanted layer 19A is formed through the ion implantation of a P type impurities, such as boron ions, for controlling the threshold voltage by using the photoresist film 18 as a mask under the thick gate insulating film 9 and the thin gate insulating film 10 of the high voltage N channel type MOS transistor and under the thin gate insulating film 10 of the N channel type MOS transistor for the level shifter. In this process, a first ion implantation is performed with a condition of 35 KeV and $1\times10^{12}/cm^2$ dose for controlling the threshold voltage of the N channel type MOS transistor for the level shifter and then, a second ion implantation is performed with a condition of 160 KeV and $1\times10^{12}/cm^2$ dose for controlling the threshold voltage of the high voltage N channel type MOS transistor. Also, the order for performing the first and second ion implantations can be reversed.

In the case, in which the ion implantation into each of the transistors for controlling the threshold voltage is performed separately, the difference in thickness of the gate insulating films 9, 10 can be utilized. In this case, the ion implantation for controlling the threshold voltage of the N channel type MOS transistor for the level shifter can be done by the self-alignment method without using the photoresist film 18. That is, the ion implanted layer 19A can be formed without using a mask by performing the ion implantation with an acceleration voltage (for example, 35 KeV acceleration voltage, as described above), which does not allow the ion implantation under the thick gate insulating film 9.

In this embodiment, since the ion implantation for controlling the threshold voltage is performed only at the thin gate insulating film 10, not at the thick gate insulating film 9, the impurity concentration of the P type well region 5 under the thick gate insulating film 9 remains low, improving the drain breakdown strength in comparison to the conventional art. However, it is also possible to implant impurities for controlling the threshold voltage both under the thin gate insulating film 10 and the thick gate insulating film so that different impurity profiles are created under the two gate insulating films.

Figure 7:
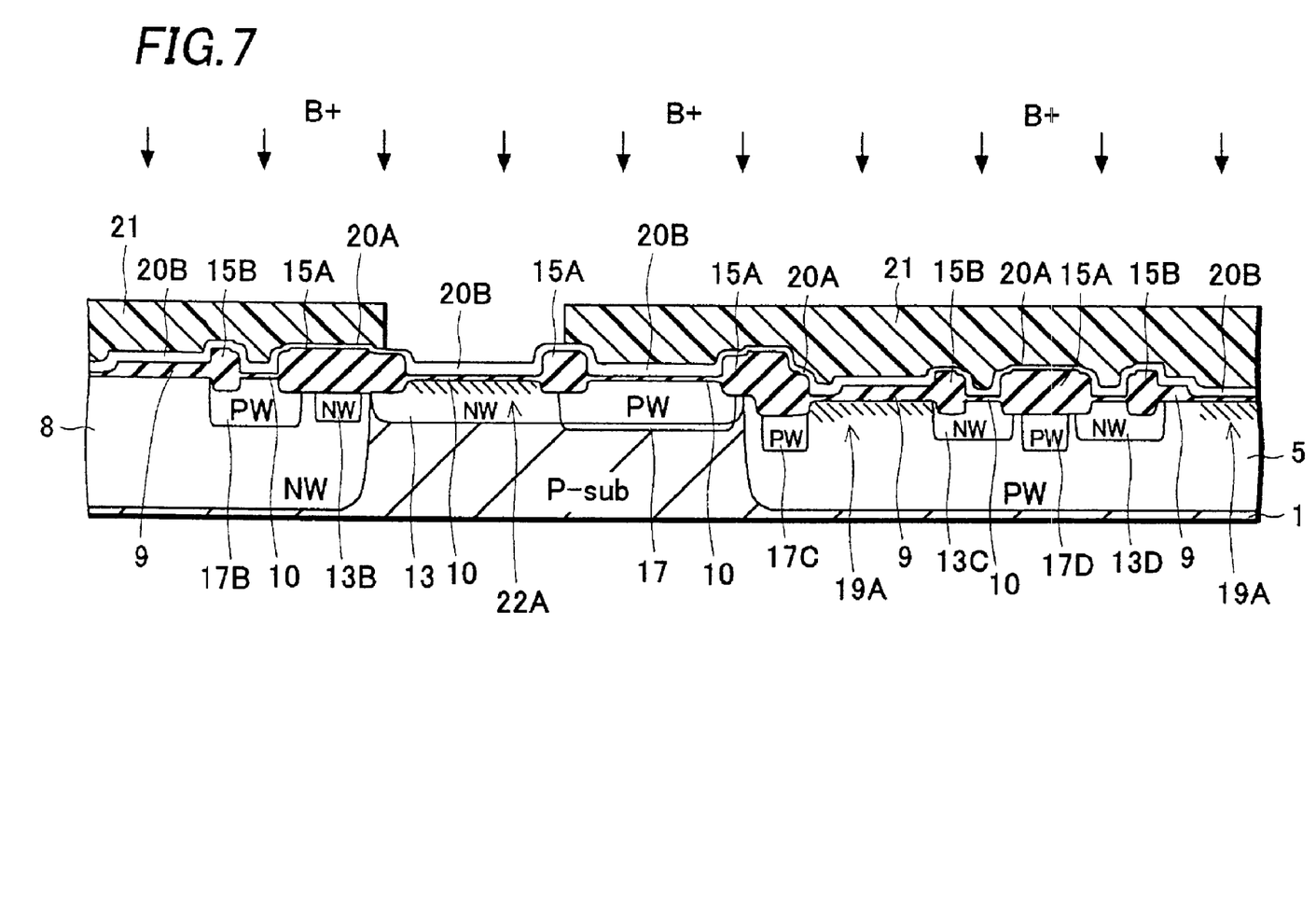
FIG. 7 is a cross-sectional view showing a device intermediate according to the manufacturing method of the semiconductor device of the embodiment, following the step of FIG. 6.

Then, as shown in FIG. 7, a polysilicon film with a thickness of 50 nm is formed on the entire surface of the substrate after removing the photoresist film 18. The thickness of the polysilicon film is different between the region where the polysilicon layer 11 has been consumed during the selective oxidation process (see FIG. 4) described above and the region where the polysilicon film 11 has not been consumed. That is, a thin polysilicon film 20A is formed above the device isolation film 15A and the second gate insulating film 15B and a thick polysilicon film 20B is formed on other regions. Also, this thick polysilicon film 20B is to be used as a part of each of gate electrodes 25A, 25B, 25C, 25D, and 25E (see FIG. 8). Furthermore, the polysilicon film is newly put on the polysilicon film 11, which has been used for forming the LOCOS insulating film, in order to obtain the polysilicon film 20B with a desirable thickness, in this embodiment. However, it is also possible to omit the process of newly putting the polysilicon film. In this case, instead of putting the polysilicon film, the thickness of the polysilicon film 11 should be adjusted.

Additionally, the polysilicon film, which has been used for forming the LOCOS insulating film, remains intact in this embodiment. Therefore, a manufacturing process can be reduced in this embodiment, compared to the case where a polysilicon film for forming the gate electrode is newly formed after removing the polysilicon film. However, this invention does not exclude the manufacturing process, where a polysilicon film for forming the gate electrode is newly formed after removing the polysilicon film used for forming the LOCOS insulating film.

Next, a photoresist film 21 is formed on the regions, where the high voltage P channel type MOS transistor, the normal voltage N channel type MOS transistor, the high voltage N channel type MOS transistor, and the N channel MOS transistor for the level shifter are to be formed.

Then, a P type impurities, such as boron ions, for controlling the threshold voltage of the normal voltage P channel type MOS transistor is implanted with a condition of 40 KeV and $2.25 \times 10^{12}/cm^2$ dose by using the photoresist film 21 as a mask, forming an ion implanted layer 22A.

Figure 8:
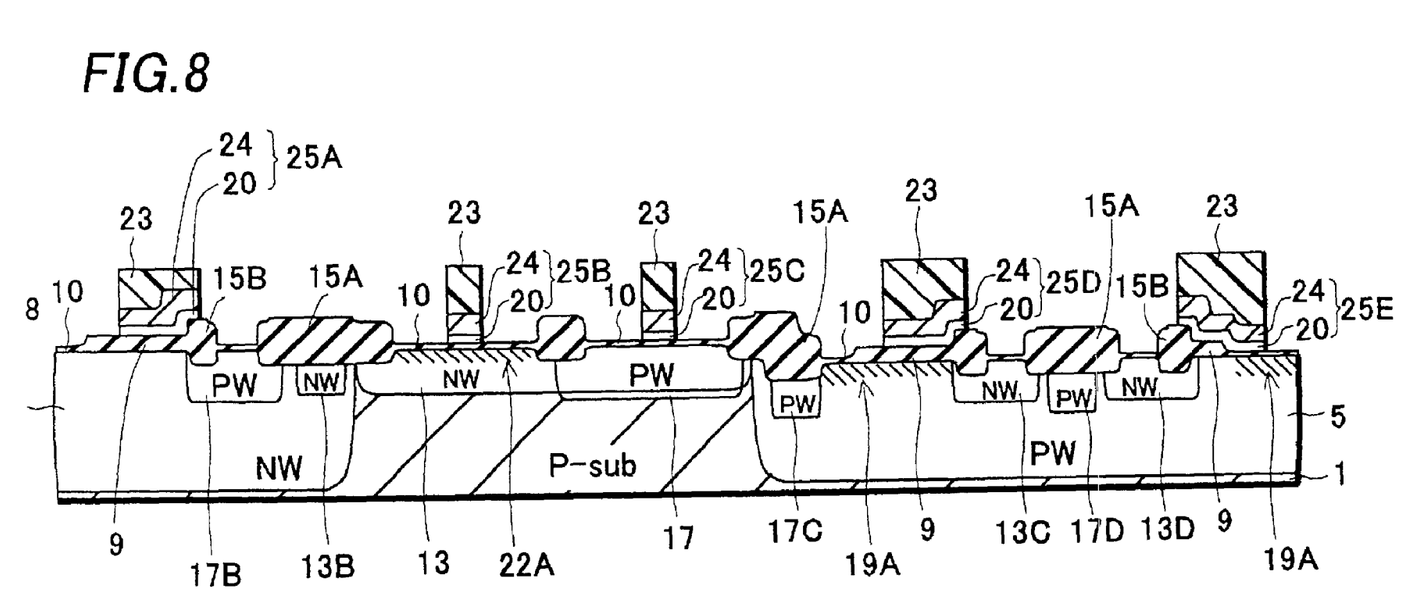
FIG. 8 is a cross-sectional view showing a device intermediate according to the manufacturing method of the semiconductor device of the embodiment, following the step of FIG. 7.

The phosphorus doping is performed to the polysilicon films 20A and 20B with $POCl_3$ as the thermal diffusion source after removing the photoresist film 21. Then, a silicide film (tungsten silicide, WSix, film in this embodiment) is formed on the polysilicon films 20A and 20B. Each of the gate electrodes 25A, 25B, 25C, 25D, and 25E has the tungsten silicide film 24 stacked on the polysilicon film 20, by patterning the tungsten silicide film and the polysilicon film using the photoresist film 23 as a mask, as shown in FIG. 8. However, the type of conductive film for forming the gate electrodes 25A, 25B, 25C, 25D, and 25D are not limited to the configuration described above. For example, a single layer structure made only from the polysilicon film can be employed.

Figure 9:
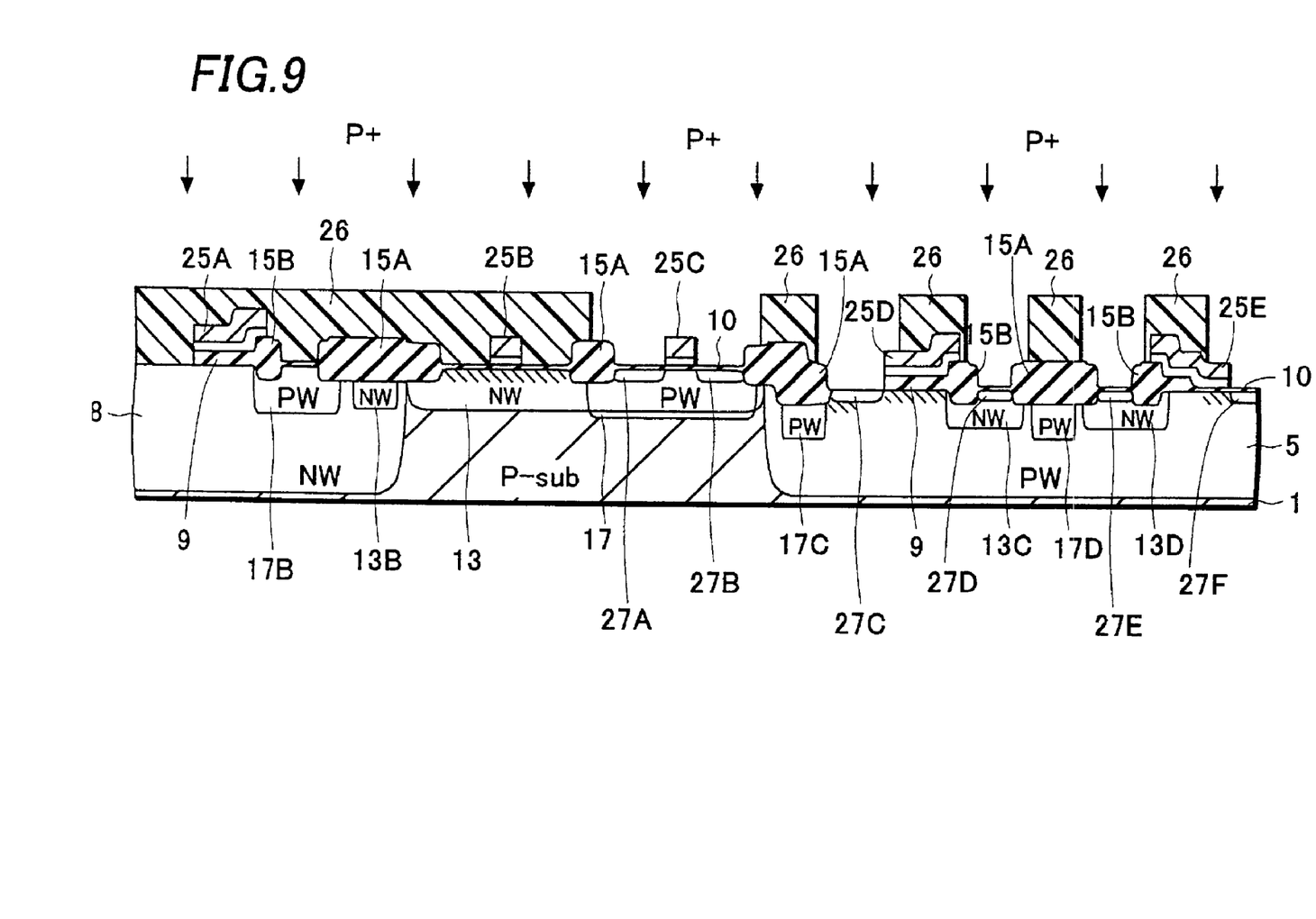
FIG. 9 is a cross-sectional view showing a device intermediate according to the manufacturing method of the semiconductor device of the embodiment, following the step of FIG. 8.

Next, the gate insulating films 9 and 10 at the source region side of the high voltage P channel type MOS transistor and the gate insulating films 9 and 10 at the source region side of the high voltage N channel type MOS transistor are removed through etching by using a photoresist film (not shown in the figure) as a mask (see FIG. 9).

Also, as shown in FIG. 9, a photoresist film 26 is formed and an ion implantation for forming low concentration N- type source and drain of each of the N channel type MOS transistors is performed by using a photoresist film 26 as a mask. That is, N type impurities, such as phosphorus ions, are implanted with a condition of 60 KeV acceleration voltage and $7.5 \times 10^{12}/cm^2$ dose with the photoresist film 26, the gate electrodes 25C, 25D, 25E, the device isolation film 15A, and the second gate insulating film 15B being used as a mask, forming low concentration source and drain regions 27A and 27B adjacent the gate electrode 25C through the gate insulating film 10, low concentration source and drain regions 27C and 27D adjacent the gate electrode 25D through the gate insulating films 9 and 15B, and low concentration source and drain regions 27E and 27F adjacent the gate electrode 25E through the gate insulating films 10 and 15B.

Figure 10:
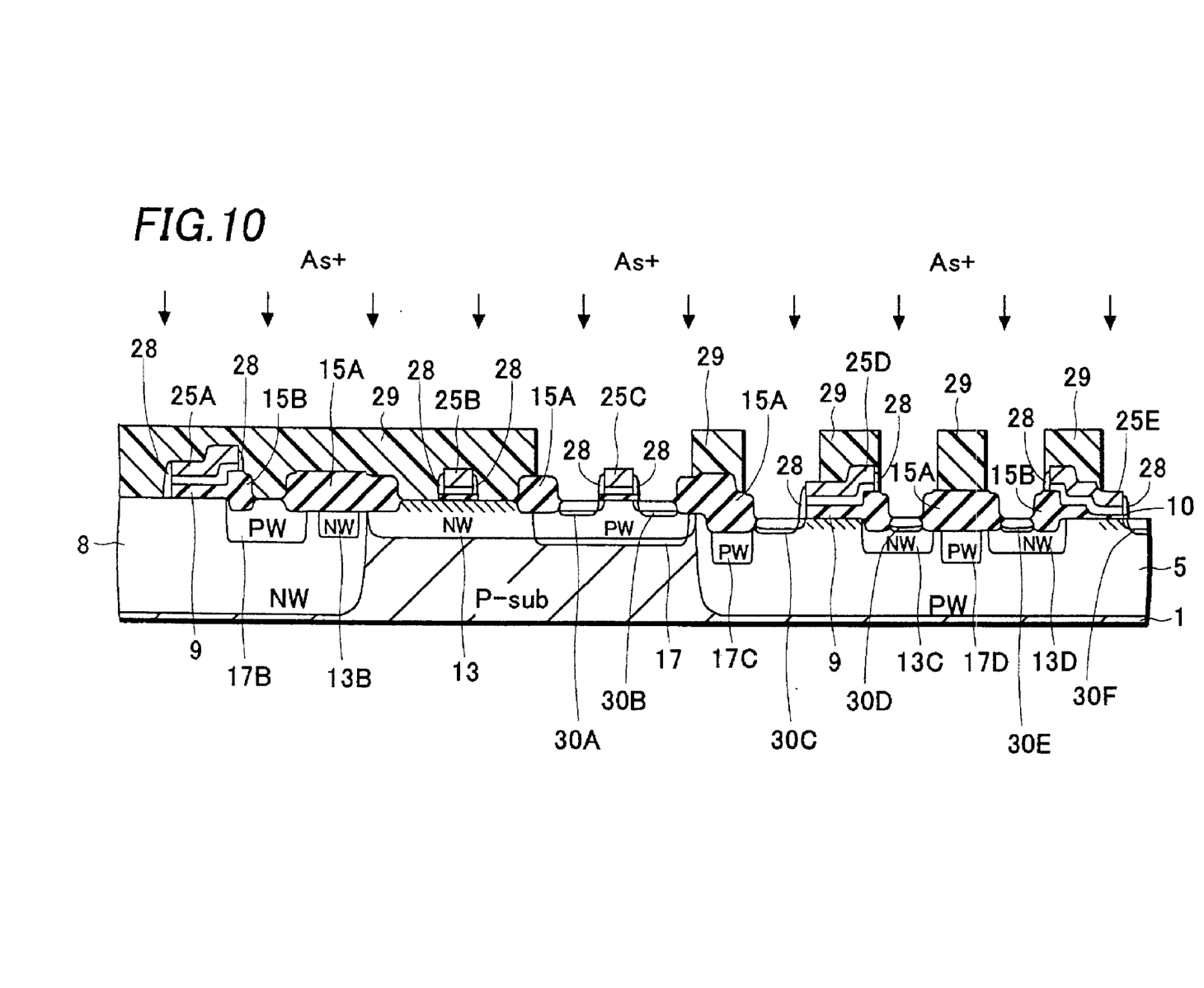
FIG. 10 is a cross-sectional view showing a device intermediate according to the manufacturing method of the semiconductor device of the embodiment, following the step of FIG. 9.

Then, a sidewall spacer film 28 is formed at the sidewall of each of the gate electrodes 25A, 25B, 25C, 25D, and 25E, as shown in FIG. 10, by performing anisotropic etching on an insulating film, which has been formed on the entire surface through CVD method with a thickness of 300 nm.

Furthermore, a photoresist film 29 is formed, and then, an ion implantation for forming high concentration N+ type source and drain of each of the N channel type MOS transistors is performed by using a photoresist film 29 as a mask. That is, an N type impurities, such as arsenic ions, are implanted with a condition of 70 KeV acceleration voltage and $5 \times 10^{15}/cm^2$ dose with the photoresist film 29, the gate electrodes 25C, 25D, 25E, the device isolation film 15A, the gate insulating film 15B and the sidewall spacer film 28 being used as a mask, forming high concentration source and drain regions 30A and 30B adjacent the gate electrode 25C through the sidewall spacer film 28, high concentration source and drain regions 30C and 30D adjacent the gate electrode 25D through the sidewall spacer film 9 and the gate insulating film 15B, and high concentration source and drain regions 30E and 30F adjacent the gate electrode 25E through the sidewall spacer film 28 and the gate insulating film 15B.

Figure 11:
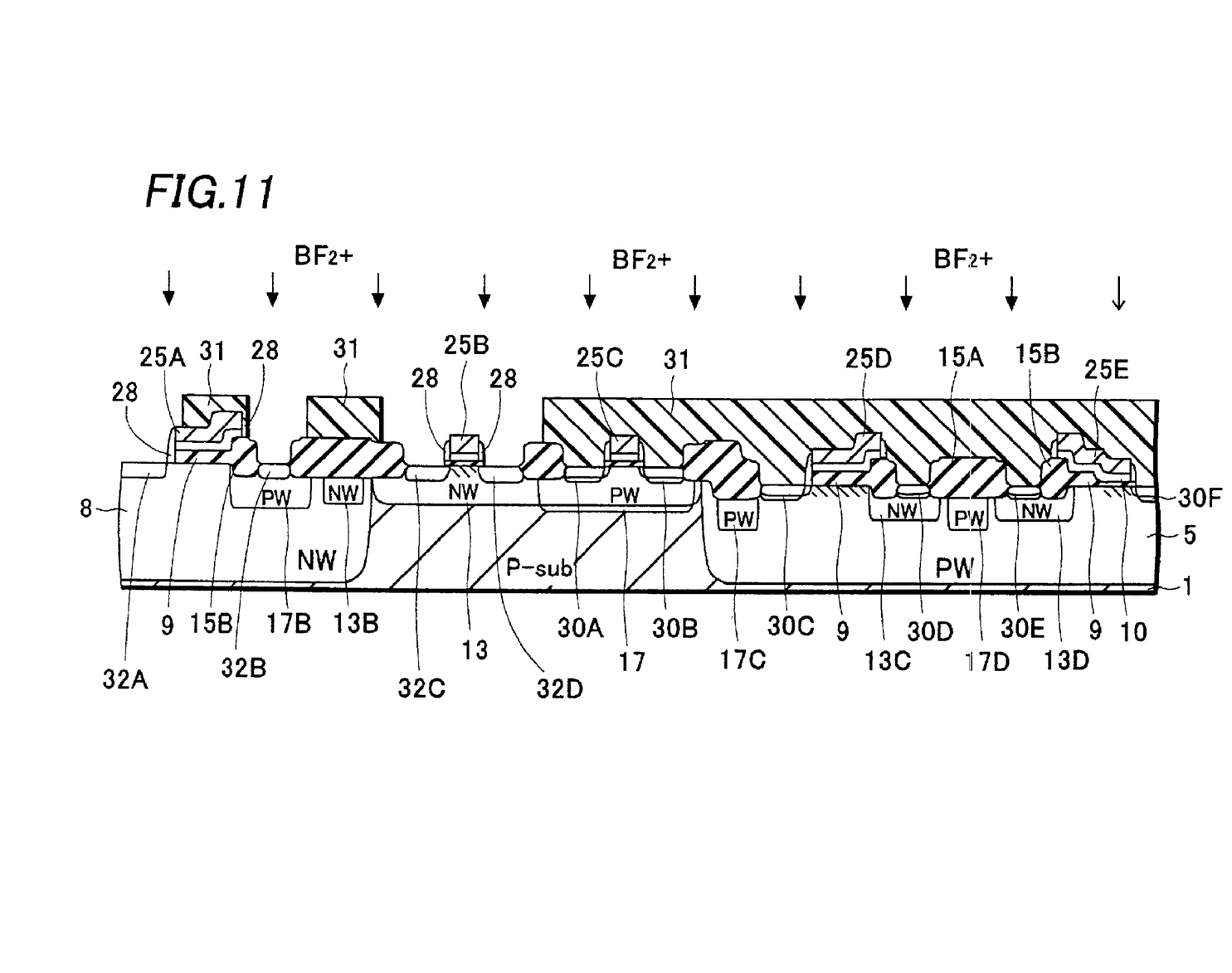
FIG. 11 is a cross-sectional view showing a device intermediate according to the manufacturing method of the semiconductor device of the embodiment, following the step of FIG. 10.

Then, a photoresist film 31 is formed and an ion implantation for forming P type source and drain of each of the P channel type MOS transistors is performed by using a photoresist film 31 as a mask. That is, P type impurities, such as boron difluoride ions, are implanted with a condition of 40 KeV acceleration voltage and $3 \times 10^{15}/cm^2$ dose with the photoresist film 31, the gate electrodes 25A, 25B, the device isolation film 15A, the gate insulating film 15B, and the sidewall spacer film 28 being used as a mask, forming source and drain regions 32A and 32B adjacent the gate electrode 25A through the sidewall spacer film 28 and the gate insulating film 15B, and source and drain regions 32C and 32D adjacent the gate electrode 25B through the sidewall spacer film 28.

Next, an interlayer insulating film 33, made of NSG (Non-doped Silicate Glass) film or BPSG (Boro-Phospho Silicate Glass), is formed, as seen from FIG. 12. Then, a metal interconnect 34 (for example, Al film, Al—Si film, Al—Si—Cu film), which makes contact with each of the source and drain regions 32A, 32B, 32C, 32D, 30A, 30B, 30C, 30D, 30E, and 30F through contact holes made in the interlayer insulating film 33, is formed. This completes the various kinds of transistors configuring the LCD driver.

Then, a passivation film (not shown in the figure) is formed on the entire surface, which completes the semiconductor device of this invention.

As explained above, among the thick gate insulating film formed by the thermal oxidation method, the gate insulating film at the source side is selectively etched and the thin gate insulating film is formed on the etched area in the LOCOS offset N channel type MOS transistor for the level shifter, as shown in FIG. 12. This ensures a high breakdown strength of the drain due to the thick gate insulating film, and at the same time, the threshold voltage can be kept low under the thin gate insulating film.

Also, in the level shifter transistor (E in FIG. 12), the gate insulating film has the three-layer structure including the thick gate insulating film 9, the thin gate insulating film 10 and the LOCOS insulating film 15B providing a LOCOS offset structure, relieving the concentration of the electric field to a degree which is not accomplished by the conventional semiconductor device with a LOCOS offset structure.

In this embodiment, as described above, the ion implantation for threshold control is made only to the portion under the thin gate insulation film 10 and not to a portion under the thick gate insulation film 9. Therefore, the impurity concentration under the thick gate insulation film 9 remains low. Because of this low impurity concentration under the thick gate insulation film 9, the maximum drain voltage applicable to the device can be significantly higher than that of the conventional structure. Furthermore, the thick gate insulation film 9 can withstand a high voltage applied at the drain electrode and, thus, further contributes to a higher maximum voltage applicable to the device.

The channel layer region under the thin gate insulating film 10 has a low threshold voltage because of the thinner insulation film and, thus, provides a large driving capacity of the device. The level of the threshold voltage is adjusted by the implantation of P-type impurities.

Although this invention is applied to the N channel type MOS transistor for the level shifter, this invention is not limited to this embodiment. It is also applicable to any high voltage MOS transistor requiring a high breakdown strength at the drain.

Also, boron ions are implanted only into the source region side of the N channel type MOS transistor for the level shifter for forming the ion implanted layer 19A for controlling the threshold voltage in this embodiment. However, this invention is not limited to this embodiment. For example, it is possible to lower the impurity concentration in the drain region side by implanting impurities, such as phosphorus ions, into the region. In this invention, the device is configured such that the impurity concentration of the ion implanted layers differs between the source region side and the drain region side, improving the break down voltage compared to the conventional device.

Additionally, this invention is applied to the level shifter made of the N channel type MOS transistor, but this invention is not limited to this embodiment. This invention is also applicable to the level shifter made of the P channel type MOS transistor.

Also, this invention is not limited to the MOS transistor for the level shifter. The invention is, for example, applicable to any high voltage MOS transistor, in which high voltage is applied only to the drain region side.

Furthermore, the semiconductor device, to which this invention is applied, is not limited to the LOCOS offset type device. This invention is applicable to a device, which ensures a high breakdown strength of the drain and improves the driving ability of the transistor, because of the gate insulating film formed by the thermal oxidation and having the thick region and the thin region.

Also, the gate insulating film having a plurality of thicknesses can be formed by repeating the processes of forming the thick gate insulating film by the thermal oxidation method, removing a part of the thick gate insulating film, and forming the thin gate insulating film for several times.

According to this invention, the breakdown voltage is improved, compared to the conventional device, based on the structure that the impurity concentration of the ion implanted layers for a threshold voltage adjustment differs between the source region side and the drain region side.

Furthermore, the ion implantation for controlling the threshold voltage is performed only under the thin gate insulating film and the ion implantation for controlling the threshold voltage is not performed under the thick gate insulating film. Therefore, the impurity concentration of the semiconductor layer under the thick gate insulating film remains low compared to the conventional art, improving the breakdown voltage of the drain.

What is claimed is:

1. A semiconductor device comprising:
    a gate insulating film formed on a semiconductor substrate and comprising three insulating films each having a different thickness;
    a gate electrode formed on the gate insulating film;
    a source region and a drain region each formed adjacent the gate electrode;
    a channel region disposed between the source region and the drain region; and
    an ion implanted layer formed in the channel region only under the thinnest insulating film of the three insulating films of the gate insulating film, the ion implanted layer defining a threshold voltage of the channel region,
    wherein the thinnest insulating film of the three insulating films is disposed adjacent the source region and the second thinnest insulating film of the three insulating films is disposed adjacent the drain region,
    only one second thinnest insulating film is disposed between the source region and the drain region, and
    at least part of the second thinnest insulating film and at least part of the thinnest insulating film are disposed on the channel region.

2. A semiconductor device having a transistor for a level shifter, the transistor comprising:
    a first gate insulating film, a second gate insulating film and a third gate insulating film each formed on a semiconductor substrate, the first gate insulating film being thicker than the second and third gate insulating films and the second gate insulating film being thicker than the third gate insulating film;
    a gate electrode formed extending over the first, second and third gate insulating films;
    a source region and a drain region each formed adjacent the gate electrode;
    a channel region disposed between the source region and the drain region; and
    an ion implanted layer formed in the channel region only under the third gate insulating film, the ion implanted layer defining a threshold voltage of the channel region,
    wherein the second gate insulating film is disposed adjacent the drain region and the third gate insulating film is disposed adjacent the source region, and
    at least part of the second gate insulating film and at least part of the third gate insulating film are disposed on the channel region.

* * * * *